(12) United States Patent
Lee et al.

(10) Patent No.: US 8,532,241 B2
(45) Date of Patent: Sep. 10, 2013

(54) TIME SYNCHRONIZATION APPARATUS BASED ON PARALLEL PROCESSING

(75) Inventors: Seung-woo Lee, Daejeon-si (KR);
Jung-hee Lee, Daejeon-si (KR);
Bhum-cheol Lee, Daejeon-si (KR)

(73) Assignee: Electronics and Telecommunications Research and Institute, Daejeon (KR)

( * ) Notice: Subject to any disclaimer, the term of this patent is extended or adjusted under 35 U.S.C. 154(b) by 596 days.

(21) Appl. No.: 12/774,866

(22) Filed: May 6, 2010

(65) Prior Publication Data
US 2011/0013737 A1 Jan. 20, 2011

(30) Foreign Application Priority Data
Jul. 20, 2009 (KR) .................. 10-2009-0066038

(51) Int. Cl.
*H04L 7/00* (2006.01)
(52) U.S. Cl.
USPC .......................................................... 375/356
(58) Field of Classification Search
USPC .......................................................... 375/356
See application file for complete search history.

(56) References Cited

U.S. PATENT DOCUMENTS

| | | | | |
|---|---|---|---|---|
| 5,727,038 A | * | 3/1998 | May et al. | 375/376 |
| 6,314,144 B1 | * | 11/2001 | Moriyama et al. | 375/316 |
| 6,903,615 B2 | * | 6/2005 | Landman et al. | 331/57 |
| 7,242,740 B2 | * | 7/2007 | Spijker et al. | 375/376 |
| 7,613,268 B2 | * | 11/2009 | Aweya et al. | 375/376 |
| 2004/0150747 A1 | * | 8/2004 | Sita | 348/558 |
| 2004/0208256 A1 | * | 10/2004 | Spijker et al. | 375/276 |
| 2005/0169416 A1 | * | 8/2005 | Liu | 375/362 |
| 2006/0056560 A1 | * | 3/2006 | Aweya et al. | 375/356 |
| 2006/0056563 A1 | * | 3/2006 | Aweya et al. | 375/376 |
| 2006/0242445 A1 | | 10/2006 | Aweya et al. | |
| 2008/0075152 A1 | | 3/2008 | Melanson | |
| 2010/0074383 A1 | | 3/2010 | Lee et al. | |

FOREIGN PATENT DOCUMENTS

| | | |
|---|---|---|
| JP | 10-229423 A | 8/1998 |
| KR | 1020080017016 A | 2/2008 |
| KR | 10-0900067 B1 | 5/2009 |
| KR | 1020100034322 A | 4/2010 |
| WO | 2006/113986 A1 | 11/2006 |

OTHER PUBLICATIONS

MatLab, "signal Processing Toolbox", version 6, 2002 p. 7-188 dfilt. parallel function.*
Etri; Multimedia Convergence Network on Chip Technology Development; 08MR2410-01-5083P; Feb. 2009; 385 pages English Translation Summary.

* cited by examiner

*Primary Examiner* — Juan A Torres
(74) *Attorney, Agent, or Firm* — Ladas & Parry LLP

(57) ABSTRACT

A parallel processing-based time synchronization apparatus employs a double-filter structure based on parallel processing, providing more precise and reliable time synchronization between a master device and a slave device. A first filter is implemented as hardware so as to realize time synchronization despite cyclic synchronization message transmission at short intervals and the second filter is implemented as software so as to realize precise time synchronization.

14 Claims, 7 Drawing Sheets

TIME SYNCHRONIZATION APPARATUS BASED ON PARALLEL PROCESSING

CROSS REFERENCE TO RELATED APPLICATION

This application claims the benefit under 35 U.S.C. §119(a) of Korean Patent Application No. 10-2009-0066038, filed on Jul. 20, 2009, in the Korean Intellectual Property Office, the entire disclosure of which is incorporated herein by reference for all purposes.

BACKGROUND

1. Field

The following description relates to time synchronization technology, and more particularly, to a parallel processing-based time synchronization apparatus, which provides more precise and reliable time synchronization between a master device and a slave device based on parallel processing.

2. Description of the Related Art

In general, to establish time synchronization between at least two devices located in a packet switching network, a protocol specific for time synchronization is required. A device which provides a reference time for the time synchronization is set as a master, and a device which is to be time synchronized to the master device is set as a slave, and then a message containing time information of each device is exchanged between the master and the slave to realize the time synchronization therebetween.

Packet switching networks which deploy low cost Ethernet technologies are gradually replacing circuit switching networks, and the need for high precision time synchronization protocol is increasing for a real time streaming service. To this end, the Institute of Electrical and Electronics Engineers (IEEE) has developed and standardized the precision time protocol (PTP) which is a synchronization protocol with high precision.

FIG. 1 illustrates a diagram of a procedure of establishing time synchronization between a master device and a slave device according to the PTP. The PTP is a synchronization protocol that synchronizes a slave device to a master device by allowing the slave and master devices to exchange synchronization messages, each of which is formed of synchronization packets and delay packets and contains Time of Day (ToD) which is time information, at intervals of a predetermined period $T_P$ when clocks of the devices to be synchronized have a master-slave relationship.

According to the synchronization protocol, the slave device computes differences (hereinafter, referred to as "time offset") between its time information and time information of the master device at intervals of a synchronization message exchange period of the synchronization protocol by use of Equations 1 and 2 below, and filters the computed value using a filter to obtain a filtered time offset value. The slave device uses the filtered time offset value to adjust time information and frequency information driven by a local clock, thereby establishing time synchronization with the master device.

$$\text{Propagation delay } Dly = [(T_{M4} - T_{M1}) - (T_{S3} - T_{S2})]/2 \quad (1)$$

$$\text{Time offset } Offs = T_{S2} - T_{M1} - Dly \quad (2)$$

Here, Offs represents a time offset value between a master device and a slave device, and Dly represents a propagation delay value between the master device and the slave device. Furthermore, $T_{M1}$ represents time information about when a synchronization packet departs from the master device, $T_{M4}$ represents time information about when a delay packet arrives at the master device, $T_{S2}$ represents time information about when the synchronization packet arrives at the slave device, and $T_{S3}$ represents time information about when the delay packet departs from the slave device.

The precision of the time synchronization indicates the degree of accuracy in time synchronization between a master device and a slave device through computation of a time offset value and delay time. Factors that improve the precision of the time synchronization include a synchronization message exchange period, a filter design, and a time stamping method.

For example, to achieve high precision time synchronization, the synchronization message exchange period may be shortened, a low-pass filter may be designed to have a narrow bandwidth or time stamping procedures for identifying starting or arrival time of synchronization messages may be implemented in a hardware fashion so that precision of a time stamp value can be increased.

In general, a series of procedures for time synchronization using synchronization protocol are implemented by software, except for a time stamp procedure. However, when it is required to accelerate the synchronization message exchange period for higher precision time synchronization, or when the load of general packets to be processed by software is increased, it is difficult to update a filter output computed by software to the slave device at each synchronization message exchange period, and if delays occur periodically, the updating of time information is accordingly delayed. Thus it becomes very difficult for reliable time synchronization to be achieved.

Moreover, when the entire time information value of the slave device is simultaneously changed in order to update a time offset value computed at each synchronization message exchange period to the slave device, phase changes abruptly occur according to the change of the time information, and as a result a problem occurs which leads to the phase noise of a reference clock generated based on the slave device increasing.

That is, when time synchronization is performed in a software manner, a processing speed is decreased due to overload of the operation processing or short synchronization message exchange period, and hence time synchronization performance deterioration and failure in synchronization may occur. On the other hand, when the time synchronization is performed in a hardware manner in order to expedite the processing speed, the design of such hardware and implementation thereof may be complicated. Thus, a need for a technology providing a more precise and reliable time synchronization between a slave device and a master device is increasing.

SUMMARY

In one general aspect, there is provided a technology for a parallel processing-based time synchronization apparatus which allows a more precise and reliable time synchronization between a slave device and a master device by use of a double-filter structure based on parallel processing.

In another general aspect, there is provided a parallel processing-based time synchronization apparatus which has a double-filter structure including a first filter and a second filter, wherein the first filter is implemented as hardware so as to realize time synchronization despite cyclic synchronization message transmission at short intervals and the second filter is implemented as software so as to realize precise time synchronization, thereby realizing a more precise and reliable time synchronization between a master device and a slave device.

In still another general aspect, there is provided a parallel processing-based time synchronization apparatus which does not update the whole time offset value at each synchronization message exchange period, but divides the synchronization message exchange period into shorter periods, wherein a smaller offset value is updated at intervals of the shorter period so that the change of phase of a reference clock is decreased and the phase noise can be reduced.

According to a general aspect, there is provided a parallel processing-based time synchronization apparatus. The parallel processing-based time synchronization apparatus computes and outputs a difference between local time information of a slave device and time information of a master device using a double filter including a first filter and a second filter, each of which low-pass filters the output signal and outputs the resultant signal, combines a signal output from the first filter and a signal output from the second filter and outputs the combined signal, and outputs local time information by adjusting time information and frequency information of the slave device according to the combined signal. The terms "signal" and "value" refer to the same element and thus they are used together.

According to another aspect, there is provided a parallel processing-based time synchronization apparatus. The parallel processing-based time synchronization apparatus computes and outputs a difference between local time information of a slave device and time information of a master device using a double filter including a first filter and a second filter, each of which low-pass filters the output signal and outputs the resultant signal, combines the signal output from the first filter and the signal output from the second filter, outputs the combined signal, upsamples the combined signal at intervals of a predetermined reference period which is shorter than intervals at which the time information of the master device is input to output the resultant signal, and outputs the local time information of the slave device by adjusting time information and frequency information of the slave device according to the signal resulting from the upsampling.

The first filter may be implemented as hardware so as to realize time synchronization despite cyclic synchronization message transmission at short intervals and the second filter may be implemented as software so as to realize precise time synchronization.

Other features will become apparent to those skilled in the art from the following detailed description, which, taken in conjunction with the attached drawings, discloses exemplary embodiments of the invention.

Figure 1:
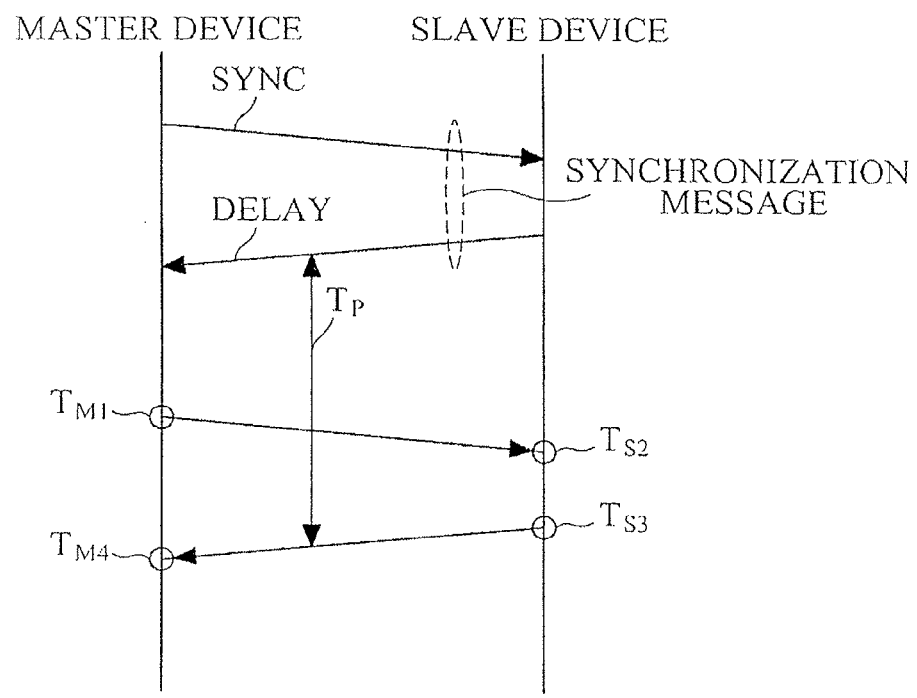
FIG. 1 is a diagram illustrating a procedure of establishing time synchronization between a master device and a slave device according to precision time protocol.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Various changes, modifications, and equivalents of the systems, apparatuses and/or methods described herein will suggest themselves to those of ordinary skill in the art. Descriptions of well-known functions and structures are omitted to enhance clarity and conciseness.

Figure 2:
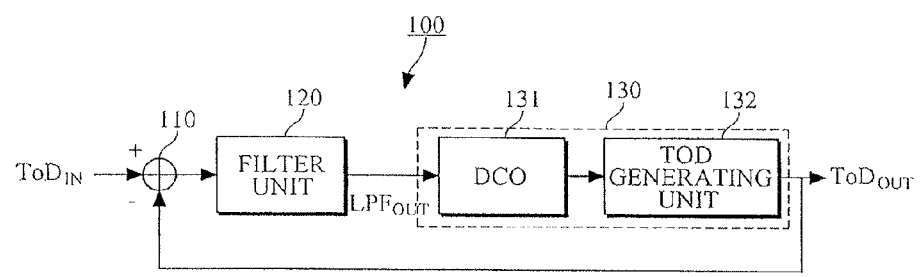
FIG. 2 is a diagram illustrating an exemplary single-filter-based time synchronization apparatus.

FIG. 2 illustrates an exemplary single-filter-based time synchronization apparatus 100. As shown in FIG. 2, the single-filter-based time synchronization apparatus 100 is configured to include a time phase detecting unit 110, a filter unit 120, and a time synchronization unit 130.

The time phase detecting unit 110 computes and outputs a time offset value which corresponds to a difference between local time information $ToD_{OUT}$ of a slave device and time information $ToD_{IN}$ of a master device.

The filter unit 120 low-pass filters a signal output from the time phase detecting unit 110 and outputs the resultant signal. In this case, the filter unit 120 receives the time offset value output from the time phase detecting unit 110 and outputs a filtered time offset value by using transfer function F(Z).

The time synchronizing unit 130 outputs the local time information of the slave device by adjusting time information and frequency information of the slave device according to the signal output from the filter unit 120, and consequently time synchronization is established.

The time synchronization unit 130 is configured to include a digitally controlled oscillator (DCO) 131 and a time of day (ToD) generating unit 132. The DCO 131 is oscillated by a local clock of the time synchronization apparatus 100, and the ToD generating unit 132 increases a time of day (ToD) value in steps of the time resolution corresponding to an oscillation frequency of the DCO 131, thereby achieving time synchronization.

When the single-filter based time synchronization apparatus 100 is implemented using software, processing speed is slowed down due to operation process overload or a short synchronization message exchange period, and thus the deterioration of time synchronization performance and the synchronization failure may occur.

If the time synchronization apparatus 100 is configured as hardware in order to accelerate the processing speed, its design and implementation may be complicated. Therefore, a time synchronization apparatus based on parallel processing which simultaneously utilizes hardware and software is required such that more precise and reliable time synchronization can be established between a master device and a slave device.

Figure 3:
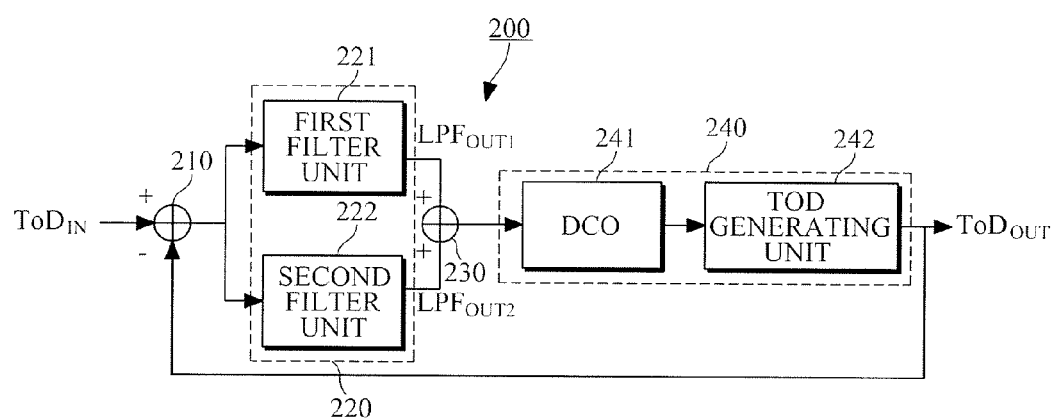
FIG. 3 is a diagram illustrating an exemplary parallel processing-based time synchronization apparatus.

FIG. 3 illustrates an exemplary parallel processing-based time synchronization apparatus 200. Referring to FIG. 3, the time synchronization apparatus 200 includes a time phase detecting unit 210, a parallel filter unit 220, a summation unit 230, and a time synchronization unit 240.

The time phase detecting unit 210 computes a difference between local time information $ToD_{OUT}$ of a slave device and time information $ToD_{IN}$ of a master device, and outputs the result. For example, the time phase detecting unit 210 periodically receives the time information $ToD_{IN}$ of the master device through a synchronization protocol, receives the local time information $ToD_{OUT}$ of the slave device fed-back from the time synchronization unit 240, calculates the difference between the local time information $ToD_{OUT}$ of the slave device and the time information $ToD_{IN}$ of the master device and outputs the difference.

In this case, the time phase detecting unit 210 may be configured to receive the local time information $ToD_{OUT}$ of the slave device each time it receives the time information $ToD_{IN}$ of the master device, and the difference between the local time information $ToD_{OUT}$ of the slave device and the time information $ToD_{IN}$ of the master device, i.e., a time offset value, may be computed using Equations 1 and 2 by subtracting time information $T_{M1}$ about when a synchronization message departs from the master device and delay time Dly from time information $T_{S2}$ about when the synchronization message arrives at the slave device.

The parallel filter unit 220 is configured as a double-filter, including a first filter 221 and a second filter 222, each low-pass filtering a signal output from the time phase detecting unit 210.

The first filter 221 of the parallel filter unit 220 may be configured as hardware to be capable of time synchronization despite cyclic synchronization message transmission at short intervals, and the second filter 222 may be configured as software to be capable of precise time synchronization.

Hence, even when synchronization message processing is delayed due to complicated processing of the second filter 222 implemented as software, the first filter 221 implemented as hardware can be used to process the synchronization message, and thus precise and reliable time synchronization between the master device and the slave device can be achieved.

The first filter 221 receives the difference between the local time information $ToD_{OUT}$ of the slave device and the time information $ToD_{IN}$ of the master device, i.e., the time offset value, which is periodically output from the time phase detecting unit 210, and low-pass filters the time offset value using a transfer function, $F_{HW}(Z)$, to output a result value $LPF_{OUT1}$.

In the same manner, the second filter 222 receives the time offset value, and low-pass filters the time offset value using a transfer function, $F_{SW}(Z)$, to output a result value $LPF_{OUT2}$.

The summation unit 230 combines the value $LPF_{OUT1}$ output from the first filter 221 and the value $LPF_{OUT2}$ output from the second filter 222, and outputs the resultant value.

At this time, if the entire low-pass filtered value $LPF_{OUT1}$, of the first filter 221 and the entire low-pass filtered value of the $LPF_{OUT2}$ of the second filter 222 are combined together, M input values of the first filter 221 may overlap with those of the second filter 222, and they may be updated to the combination result. Thus, to avoid such duplication, the output value $LPF_{OUT2}$ of the second filter 222 should be obtained by subtracting the output value $LPF_{OUT1}$ of the first filter 221 from the output value of the filter unit 220. The output value $LPF_{OUT2}$ of the second filter 222 obtained as such may be represented as:

$$LPF_{OUT2}=F(Z)-F_{HW}(Z)=LPF_{OUT}-LPF_{OUT1} \quad (3)$$

Here, $LPF_{OUT2}$ denotes an output value of the second filter 222, F(Z) denotes a transfer function of the filter unit 120 of the single-filter-based time synchronization apparatus 100 shown in FIG. 2, $F_{HW}(Z)$ denotes a transfer function of the first filter 221, $LPF_{OUT}$ denotes an output value of the filter unit 120, and $LPF_{OUT1}$ is an output value of the first filter 221.

When Equation 3 is transposed and $LPF_{OUT2}$, of the second filter 222 and $LPF_{OUT1}$ of the first filter 221 are combined, the resultant value becomes the same as $LPF_{OUT}$ of the filter unit 120 of the time synchronization apparatus 100 of FIG. 2.

Hence, the parallel filter unit 220 of the parallel processing-based time synchronization apparatus 200 of in FIG. 3 can have the same result as the filter unit 120 of the single-filter-based time synchronization apparatus 100 of FIG. 2.

For example, on the assumption that the filter unit 120 of the single-filter-based time synchronization apparatus 100 of FIG. 2 outputs an average of N input values, the filter unit 120 sequentially stores previous contiguous N input values including a current input value, and outputs the average of the stored input values.

The output value of the single-filter-based time synchronization apparatus 100 of FIG. 2 may be represented as:

$$LPF_{OUT} = \frac{\sum_{i=1}^{N} OFFS(i)}{N} \quad (4)$$

Here, $LPF_{OUT}$ denotes an output value of the filter unit 120 of the single-filter-based time synchronization apparatus 100 of FIG. 2, OFFS(i) denotes an ith obtained time offset value, and N denotes the number of input values of the filter unit 120.

In the parallel filter unit 220 of the parallel-processing-based time synchronization apparatus 200 of FIG. 3, the first filter 221 stores M (smaller than N) input values, filters the values and outputs the resultant value, and the second filter 222 stores N input values, filters the values and outputs the resultant value.

The relationship between the output from the first filter unit 221 and the output from the second filter 222 for obtaining the same output value as the result of Equation 4 may be represented as:

$$LPF_{OUT2} = LPF_{OUT} - LPF_{OUT1} = \frac{\sum_{i=1}^{N} OFFS(i)}{N} - \frac{\sum_{i=1}^{M} OFFS(i)}{M} \quad (5)$$

Here, $LPF_{OUT2}$ denotes an output value of the second filter 222, $LPT_{OUT}$ denotes an output value of the filter unit 120 of the single-filter-based time synchronization apparatus 100 of FIG. 2, N denotes the number of input values of the second filter 222, M denotes the number of input values of the first filter 221, and OFFS(i) denotes an ith obtained time offset value.

Since the result of combining the output value of the second filter 222 and the output value of the first filter 221 is the same as the output value of the filter unit 120 of the single-filter-based time synchronization apparatus 100 obtained by Equation 4, the parallel filter unit 220 of the parallel processing-based time synchronization apparatus 200 of FIG. 3 has the same output value as the filter unit 120 of the single-filter-based time synchronization apparatus 100 of FIG. 2.

The time synchronization unit 240 adjusts time information and frequency information of the slave device according to a signal output from the summation unit 230, and outputs the local time information of the slave device.

The time synchronization unit 240 includes a digitally controlled oscillator (DCO) 241 and a time of day (ToD) generating unit 242. The DCO 241 is oscillated by a local clock of the time synchronization apparatus 200 and the ToD generating unit 242 increases a ToD value in steps of the time resolution, which corresponds to an oscillation frequency of the DCO 241, thereby achieving time synchronization.

As such, one filter of the time synchronization apparatus based on parallel processing is configured as hardware to realize time synchronization regardless of the operation processing capability for a synchronization message, and another filter is configured as software to realize precise time synchronization. Consequently, even when processing of a synchronization message is delayed in the filter implemented as software due to complicated operation processing, the filter implemented as hardware can process the synchronization message, and thus more precise and reliable time synchronization between the master device and the slave device can be achieved.

Figure 4:
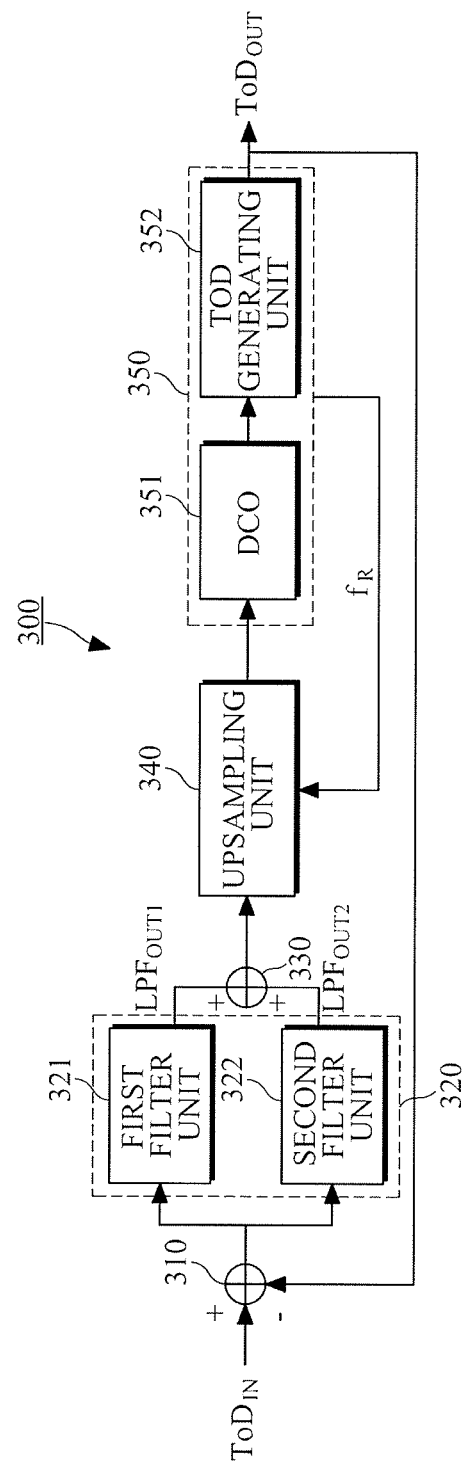
FIG. 4 is a diagram illustrating another exemplary parallel processing-based time synchronization apparatus.

FIG. 4 illustrates another exemplary parallel processing-based time synchronization apparatus 300. Referring to FIG. 4, the parallel processing-based time synchronization apparatus 300 has a similar configuration to the time synchronization apparatus illustrated in FIG. 3, and includes a time phase detecting unit 310, a parallel filter unit 320, an upsampling unit 340, a summation unit 330, and a time synchronization unit 350.

The time phase detecting unit 310 computes a difference between local time information of a slave device and time information of a master device and outputs the difference. For example, the time phase detecting unit 310 periodically receives time information $ToD_{IN}$ of a master device through a synchronization protocol, and local time information $ToD_{OUT}$ of a slave device which is fed back from the time synchronization unit 350, calculates a difference between the local time information $ToD_{OUT}$ of the slave device and the time information $ToD_{IN}$ of the master device and, and outputs the difference.

The time phase detecting unit 310 may be configured to receive the local time information $ToD_{OUT}$ of the slave device each time it receives the time information $ToD_{IN}$ of the master device, and the difference between the local time information $ToD_{OUT}$ of the slave device and the time information $ToD_{IN}$ of the master device, i.e., a time offset value, may be computed by subtracting time information $T_{M1}$ about when a synchronization message departs from the master device and delay time Dly from time information $T_{S2}$ about when the synchronization message arrives at the slave device as shown in Equations 1 and 2.

The parallel filter unit 320 is configured as a double-filter, including a first filter 321 and a second filter 322, each of which low-pass filters a signal output from the time phase detecting unit 310.

The first filter 321 of the parallel filter unit 320 is implemented as hardware to be capable of time synchronization despite cyclic synchronization message transmission at short intervals, and the second filter 222 may be configured as software to be capable of precise time synchronization.

Therefore, even when synchronization message processing is delayed due to complicated processing of the second filter 322 implemented as software, the first filter 321 implemented as hardware can be used to process the synchronization message, and thus the precise and reliable time synchronization between the master device and the slave device can be achieved.

The first filter 321 receives the difference between the local time information $ToD_{OUT}$ of the slave device and the time information $ToD_{IN}$ of the master device, i.e., the time offset value, which is periodically output from the time phase detecting unit 310, and low-pass filters the time offset value using a transfer function, $F_{HW}(Z)$, to output a resultant value.

In the same manner, the second filter 322 receives the time offset value, and low-pass filters the time offset value using a transfer function, $F_{SW}(Z)$, to output a resultant value.

The summation unit 330 combines the value output from the first filter 321 and the value output from the second filter 322, and outputs the resultant value.

At this time, if the entire low-pass filtered value of the first filter 321 and the entire low-pass filtered value of the second filter 322 are combined together, M input values of the first filter 321 may overlap with those of the second filter 322, and they may be updated in the combination result. Thus, to avoid such duplication, the output value of the second filter 322 should be obtained by subtracting the output value of the first filter 321 from the output value of the filter unit 320.

The upsampling unit 340 upsamples a signal output from the summation unit 330 at intervals of a predetermined reference interval which is shorter than an interval at which the time information of the master device is input.

For example, the upsampling unit 340 computes a period $T_P/T_R$ by dividing the synchronization message exchange period of the synchronization protocol by a shorter period $T_R$, and performs sampling at each reference period of a clock which is obtained by multiplying the period $T_P/T_R$ by an output value of the summation unit 330.

$T_P$ represents a synchronization message transmission or exchange period of a synchronization protocol, and $T_R$ represents a reference period ($T_R=1/f_R$) of a synchronized clock of the parallel processing-based time synchronization apparatus 300.

That is, the upsampling unit 340 upsamples the time offset value such that the time offset value which is updated at each synchronization message exchange period can be divided into smaller values and the divided values are updated at shorter intervals.

The time synchronization unit 350 adjusts time information and frequency information of the slave device and outputs the local time information of the slave device according to the signal output from the summation unit 340.

In addition, the time synchronization unit 350 is configured to include a digitally controlled oscillator (DCO) 351 and a time of day (ToD) generating unit 352. The DCO 351 is oscillated by a local clock of the parallel processing-based time synchronization apparatus 300, and the ToD generating unit 352 increases a time of day (ToD) value in steps of the time resolution corresponding to an oscillation frequency of the DCO 351, thereby achieving time synchronization.

Thus, as described above, one filter of the parallel processing-based time synchronization apparatus is configured as hardware to realize time synchronization regardless of operation processing capability of a synchronization message, and another filter is configured as software to realize precise time synchronization, so that even when processing of a synchronization message is delayed in the filter implemented as software due to complicated operation processing, the filter implemented as hardware can process the synchronization message, and thus precise and reliable time synchronization between the master device and the slave device can be achieved.

Moreover, the parallel processing-based time synchronization apparatus does not update the whole time offset value at each synchronization message exchange period, but divides the synchronization message exchange period into shorter periods and a smaller offset value is updated at each divided period, so that the change of phase of a reference clock is decreased and as such the phase noise can be reduced.

Figure 5:
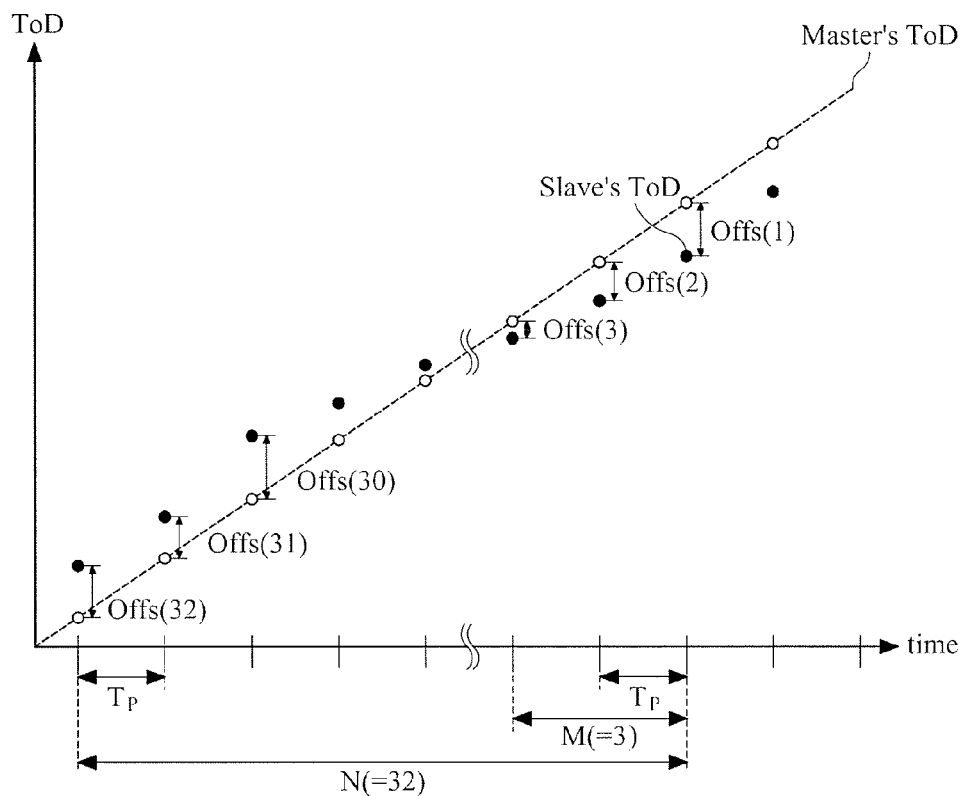
FIG. 5 is a graph showing a relationship between time information of a master device and time information of a slave device when a synchronization message exchange period of a synchronization protocol is $T_P$.
Figure 6:
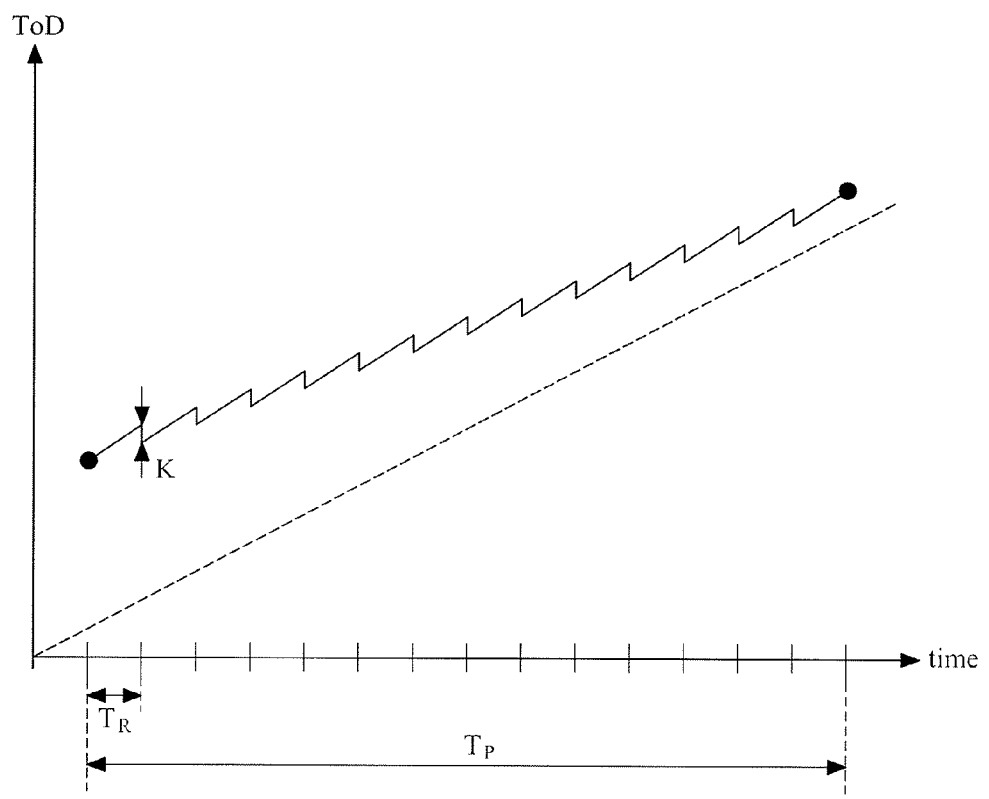
FIG. 6 is a graph showing a time offset value which is to be updated at an interval of a synchronization message exchange period and is divided by a shorter interval.

Hereinafter, a time synchronization operation of a parallel processing-based time synchronization apparatus will be described with reference to FIGS. 5 to 7. FIG. 5 illustrates a graph showing the relationship between time information of a master device and time information of a slave device when a synchronization message exchange period of a synchronization protocol is $T_P$.

It is assumed that a first filter receives M inputs, a second filter receives N inputs, a transfer function of each filter is to output an average of its inputs and synchronization messages are exchanged between the slave and master devices by use of the synchronization protocol, and a time offset value is computed using Equation 1 and Equation 2.

The master device transfers the synchronization message to the slave device at each $T_P$, and the parallel processing-based time synchronization apparatus mounted on the slave device uses a difference between local time information of the slave device and time information of the master device, i.e., time offset, to realize synchronization with the master device.

In FIG. 5, the x-axis represents time, and the y-axis represents time of day (ToD) value. A dotted line depicts a ToD value of the master device according to time, and it is assumed that the ToD value increases uniformly. In addition, it is assumed that the ToD value of the slave device has a time offset difference with respect to a clock of the master device, since the ToD value of the slave device is driven by a local clock.

A time offset value computed each time a synchronization message is exchange, is obtained according to a difference between the ToD value of the master device and the ToD value of the slave device. In FIG. 5, the time offset is denoted by Offs[i], where i denotes an ith exchanged synchronization message, and an exchange period is denoted by $T_P$.

The ToD value of the slave device has an error of a time offset which is caused by a frequency drift of a local clock and a quantization error of a time stamping value according to the time resolution of the local clock.

In FIG. 5, the time offset computed at each $T_P$ is input to the first filter and the second filter, and each of the first filter and the second filter stores a predetermined number of time offset values to be used as filter inputs, and generates output values which are filtered by a transfer function.

For convenience of explanation, it is assumed that a filter function divides the filter inputs into groups of a predetermined number of filter inputs, and obtains the average of each group of filter inputs. The first filter and the second filter stores M (=3) time offset values and N (=32) time offset values as filter inputs, respectively. The average of the filter inputs of each filter is obtained by Equations 6 and 7, respectively.

$$\text{Offs\_f1} = \left( \frac{\sum_{i=1}^{M} OFFS(i)}{M} \right) \tag{6}$$

$$\text{Offs\_f2} = \left( \frac{\sum_{i=1}^{N} OFFS(i)}{N} \right) - \left( \frac{\sum_{i=1}^{M} OFFS(i)}{M} \right) \tag{7}$$

Here, Off_f1 represents an output of the first filter and Off_f2 represents an output of the second filter.

As described above, when the output of the first filter is Offs_f1, the output of the second filter is Off_f2 and the resulting value of summation of these two outputs by a summation unit is Offs_f, a time synchronization unit of the time synchronization apparatus adjusts time information and frequency information of the slave device according to a signal output from the summation unit, and outputs local time information of the slave device, thereby realizing time synchronization between the master device and the slave device.

In this case, an upsampling unit is used to achieve more precise and reliable time synchronization by reducing phase noise. Specifically, as shown in FIG. 6, the upsampling unit adjusts the ToD value by increasing or decreasing the ToD value by a predetermined value K at an interval of a period of $T_R$ which is shorter than the synchronization message exchange period $T_P$ of the synchronization protocol.

$T_R$ may be determined according to the design of hardware, and may be set as a reference clock $1/f_R$ for a local clock. The predetermined value K may be obtained by Equation 8 below.

$$K = \text{Offs\_f}/(T_P/T_R) \tag{8}$$

Here, Offs_f represents a value obtained by adding an output from the first filter and an output from the second filter, $T_P$ represents a synchronization message exchange period, and $T_R$ represents a period of a reference clock, which is shorter than $T_P$.

For example, when Offs_f is 1 micro seconds as a result of filter output, $T_P$ is 1 seconds, $T_R$ is 100 micro seconds, and K is 100 pico seconds. Therefore, the ToD value driven by a local clock of the slave device is adjusted by being increased or decreased by 100 pico seconds at every 100 micro sec.

That is, as shown in FIG. 5, the time of the slave device synchronized with the master device is adjusted in response to a synchronization message exchanged at every 1 sec using a synchronization protocol, a value, 1 micro seconds, which has passed through the time phase detecting unit, the first filter and the second filter, is obtained by adding 100 pico seconds 10000 times at an interval of $T_R$=100 micro seconds, which is shorter than $T_P$.

Thus, the whole time offset value is not updated at one point in time, but instead it is gradually modified using smaller offset values divided from the time offset value are updated at shorter periods, and accordingly, the change of phase of a clock corresponding to a reference clock is decreased, and as such the phase noise thus can be reduced, thereby achieving more precise and reliable time synchronization.

Figure 7:
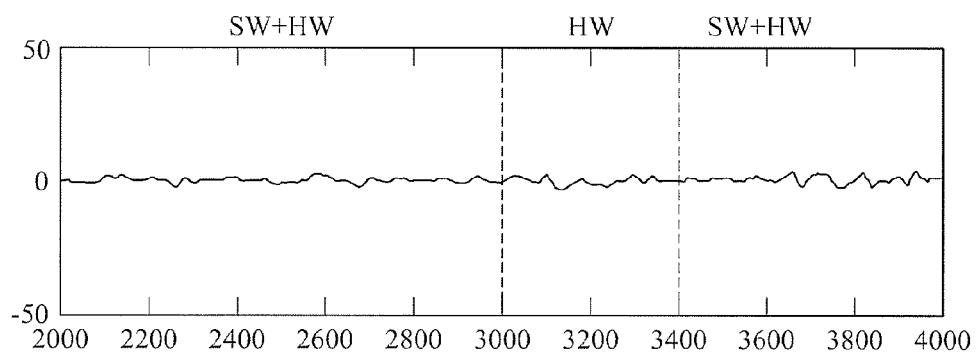
FIG. 7 illustrates a simulation result of a clock error of an exemplary parallel processing-based time synchronization apparatus over time.
Figure 8:
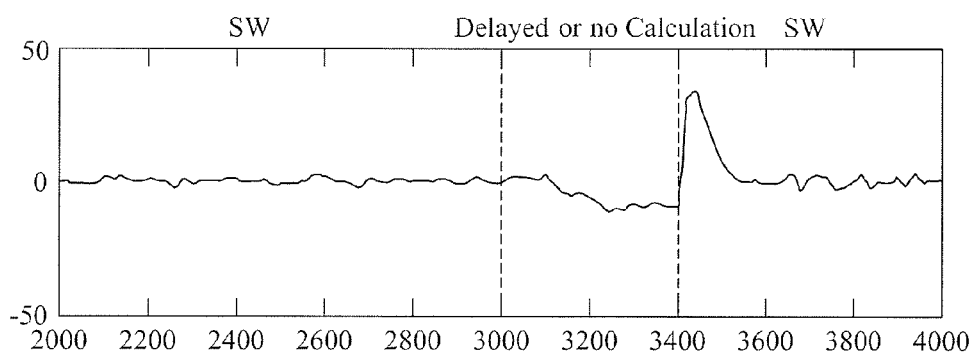
FIG. 8 illustrates a simulation result of a clock error of a single-filter-based time synchronization apparatus.

FIG. 7 illustrates a simulation result of a clock error of the parallel processing-based time synchronization apparatus over time, and FIG. 8 illustrates a simulation result of a clock error of a single-filter-based time synchronization apparatus implemented as software. In graphs, X-axis represents time and Y-axis represents a time error between a master device and a slave device.

In the parallel processing-based time synchronization apparatus described above, which includes the parallel filter unit including one filter implemented as hardware and another filter implemented as software, as shown in a time section between 3000 and 3400 of FIG. 7, even when the calculation of a filter output value of the filter implemented as software is delayed due to a large operation processing load or the calculation result is not updated, the filter implemented as hardware can output the filter value constantly, and thus the time synchronization performance can be regarded as greatly improved.

In a single filter-based time synchronization apparatus including a filter implemented as software, as shown in a time section between 3000 and 3400 of FIG. 8, when the calculation of a filter output value of software (filter) is delayed due to an operation processing load or the calculation result is not updated, an error between a clock of a master device and a clock of a slave device is consequently increased, and at time 3400 when the software (filter) starts again the operation processing normally, the filter output value is newly converged.

Hence, as understood from the simulation results of FIGS. 7 and 8, in a single filter implemented as software, errors of time synchronization is increased due to inevitable limitations processing capability and processing delay time of the software, whereas in a parallel processing based double filter structure including software and hardware, errors of time synchronization due to the characteristics of the software are rarely seen.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A parallel processing-based time synchronization apparatus comprising:
    a time phase detecting unit to compute and output a difference between local time information of a slave device and time information of a master device;
    a parallel filter unit including a first filter and a second filter, each of which low-pass filters a signal output from the time phase detecting unit and outputs the resultant signal;
    a summation unit to combine a signal output from the first filter and a signal output from the second filter and output the combined signal; and
    a time synchronization unit to output local time information by adjusting time information and frequency information of the slave device according to the signal output from the summation unit, wherein the first filter of the parallel filter unit is implemented as hardware so as to realize time synchronization despite cyclic synchronization message transmission at short intervals and the second filter of the parallel filter unit is implemented as software so as to realize precise time synchronization.

2. The parallel processing-based time synchronization apparatus of claim 1, wherein the parallel filter unit has a transfer function F(Z) such that a difference between the transfer function F(Z) and a transfer function $F_{HW}(Z)$ of the first filter becomes a transfer function of the second filter.

3. The parallel processing-based time synchronization apparatus of claim 1, wherein the time phase detecting unit receives the time information of the master device periodically via a synchronization protocol.

4. The parallel processing-based time synchronization apparatus of claim 1, wherein the time phase detecting unit receives the local time information of the slave device output and fed back from the time synchronization unit.

5. The parallel processing-based time synchronization apparatus of claim 3, wherein the time phase detecting unit receives the local time information of the slave device each time when receiving the time information of the master device.

6. The parallel processing-based time synchronization apparatus of claim 3, wherein the time phase detecting unit computes a difference between the local time information of the slave device and the time information of the master device by subtracting time information about when a synchronization message departs from the master device and delay time from time information about when the synchronization message arrives at the slave device.

7. A parallel processing-based time synchronization apparatus comprising:
    a time phase detecting unit to compute and output a difference between local time information of a slave device and time information of a master device;
    a parallel filter unit including a first filter and a second filter, each of which low-pass filters a signal output from the time phase detecting unit and outputs the resulting signal;
    a summation unit to combine the signal output from the first filter and the signal output from the second filter and output the combined signal;
    an upsampling unit to upsample the signal output from the summation unit at intervals of a predetermined reference period which is shorter than intervals at which the time information of the master device is input and to output the resultant signal; and
    a time synchronization unit to output the local time information of the slave device by adjusting time information and frequency information of the slave device according to the signal output from the upsampling unit, wherein the first filter of the parallel filter unit is implemented as hardware so as to realize time synchronization despite cyclic synchronization message transmission at short intervals and the second filter of the parallel filter unit is implemented as software so as to realize precise time synchronization.

8. The parallel processing-based time synchronization apparatus of claim 7, wherein the parallel filter unit has a transfer function F(Z) such that a difference between the transfer function F(Z) and a transfer function $F_{HW}(Z)$ of the first filter becomes a transfer function of the second filter.

9. The parallel processing-based time synchronization apparatus of claim 7, wherein the time phase detecting unit receives the time information of the master device periodically via a synchronization protocol.

10. The parallel processing-based time synchronization apparatus of claim 9, wherein the time phase detecting unit receives the local time information of the slave device output and fed back from the time synchronization unit.

11. The parallel processing-based time synchronization apparatus of claim 10, wherein the time phase detecting unit receives the local time information of the slave device each time when receiving the time information of the master device.

12. The parallel processing-based time synchronization apparatus of claim 11, wherein the time phase detecting unit computes a difference between the local time information of the slave device and the time information of the master device by subtracting time information about when a synchronization message departs from the master device and delay time from time information about when the synchronization message arrives at the slave device.

13. The parallel processing-based time synchronization apparatus of claim 7, wherein the upsampling unit obtains a value by dividing a synchronization message exchange period $T_p$ by a shorter period $T_R$, multiplies the obtained value with an output value from the summation unit and samples the multiplied value at intervals of a reference period of a clock.

14. A parallel processing-based time synchronization apparatus comprising:
 a parallel filter unit including a first filter and a second filter, each of which low-pass filters a respective input signal and outputs respective resultant signals;
 a summation unit to combine the respective resultant signals and outputs the combined signal; and
 a time synchronization unit to output local time information by adjusting time information and frequency information of a slave device according to the combined signal, wherein the first filter of the parallel filter unit is implemented as hardware and the second filter of the parallel filter unit is implemented as software.

* * * * *